(12) United States Patent
Saito et al.

(10) Patent No.: US 8,995,142 B2
(45) Date of Patent: Mar. 31, 2015

(54) POWER MODULE AND METHOD FOR MANUFACTURING THE SAME

(75) Inventors: Masato Saito, Hitachinaka (JP); Hiroyuki Abe, Hitachiomiya (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 13/577,519

(22) PCT Filed: Aug. 24, 2010

(86) PCT No.: PCT/JP2010/005200
§ 371 (c)(1),
(2), (4) Date: Aug. 7, 2012

(87) PCT Pub. No.: WO2011/117935
PCT Pub. Date: Sep. 29, 2011

(65) Prior Publication Data
US 2013/0010440 A1    Jan. 10, 2013

(30) Foreign Application Priority Data

Mar. 24, 2010 (JP) .................... 2010-067099

(51) Int. Cl.
*H05K 5/00* (2006.01)
*H05K 1/18* (2006.01)
(Continued)

(52) U.S. Cl.
CPC .............. *H01L 23/24* (2013.01); *H01L 23/296* (2013.01); *H01L 24/29* (2013.01); *H01L 24/32* (2013.01); *H01L 25/16* (2013.01); *H01L 23/3135* (2013.01); *H01L 2224/29111* (2013.01); *H01L 2224/32225* (2013.01);
(Continued)

(58) Field of Classification Search
USPC .................... 361/705–812; 174/250–268, 174/50.61–50.64
See application file for complete search history.

(56) References Cited

U.S. PATENT DOCUMENTS 4,893,215 A * 1/1990 Urushiwara et al. .......... 361/739
5,461,256 A * 10/1995 Yamada et al. ................ 257/679
(Continued)

FOREIGN PATENT DOCUMENTS

JP    6-334070 A    12/1994
JP    10-50897 A    2/1998
(Continued)

OTHER PUBLICATIONS

International Search Report including English language translation dated Nov. 2, 2010 (Six (6) pages).

*Primary Examiner* — Jerry Wu
(74) *Attorney, Agent, or Firm* — Crowell & Moring LLP

(57) ABSTRACT

Provided is a power module invented for easy manufacturing and fatigue reduction at a soldered portion, and a method for manufacturing the same. The power module according to the present invention comprises a substrate where electronic parts are mounted by soldering, and a mold case housing the substrate and including bus bars for electrical connection with an external apparatus. The mold case comprises partition plates forming an electronic part mount area where electronic parts are mounted on the substrate, and a bonding area for bonding to the bus bars, a first resin cast to the electronic part mount area, and a second resin cast to the bonding area.

11 Claims, 4 Drawing Sheets

(51) Int. Cl.
*H05H 1/03* (2006.01)
*H05K 1/00* (2006.01)
*H01L 23/24* (2006.01)
*H01L 23/29* (2006.01)
*H01L 23/00* (2006.01)
*H01L 25/16* (2006.01)
*H01L 23/31* (2006.01)

(52) U.S. Cl.
CPC ........... *H01L 2224/45014* (2013.01); *H01L 2224/45124* (2013.01); *H01L 2224/45147* (2013.01); *H01L 2224/48091* (2013.01); *H01L 2224/48227* (2013.01); *H01L 2224/48472* (2013.01); *H01L 2224/49175* (2013.01); *H01L 2224/73265* (2013.01); *H01L 2924/01004* (2013.01); *H01L 2924/01013* (2013.01); *H01L 2924/01014* (2013.01); *H01L 2924/01029* (2013.01); *H01L 2924/0105* (2013.01); *H01L 2924/01082* (2013.01); *H01L 2924/13091* (2013.01); *H01L 2924/16315* (2013.01); *H01L 2924/19041* (2013.01); *H01L 2924/19043* (2013.01); *H01L 2924/19107* (2013.01); *H01L 24/48* (2013.01); *H01L 2224/2919* (2013.01); *H01L 2924/01006* (2013.01); *H01L 2924/01033* (2013.01); *H01L 2924/014* (2013.01); *H01L 2924/0665* (2013.01); *H01L 2224/29101* (2013.01); *H01L 24/49* (2013.01); *H01L 2224/49111* (2013.01); *H01L 2924/157* (2013.01)
USPC ........... 361/752; 361/754; 361/756; 361/757; 361/758; 361/759; 361/760; 361/761; 361/762; 174/250; 174/255; 174/258

(56) References Cited

U.S. PATENT DOCUMENTS

2003/0086246 A1* 5/2003 Wakabayashi et al. ........ 361/728
2009/0086454 A1* 4/2009 Sakamoto et al. ............ 361/796

FOREIGN PATENT DOCUMENTS

| JP | 2003-243609 A | | 8/2003 |
|----|---------------|---|--------|
| JP | 2003243609 A | * | 8/2003 |
| JP | 2004-259992 A | | 9/2004 |
| JP | 2005-56873 A | | 3/2005 |
| JP | 2006-351737 A | | 12/2006 |
| JP | 2008-187143 A | | 8/2008 |

* cited by examiner

POWER MODULE AND METHOD FOR MANUFACTURING THE SAME

TECHNICAL FIELD

The present invention relates to a power module and a method for manufacturing the same. More particularly, the present invention relates to a power module suitable for vehicle mounting with an excellent reliability of soldered portions, and a method for manufacturing the same.

BACKGROUND ART

A power module supplying a large current needs a solution to a heat generated by supplying the large current. One solution to the heat generation problem is how efficiently the generated heat is dissipated to the outside, wherefore various techniques for external dissipation have been invented and adopted to the power module.

Further, another solution needed to be considered is a difference in the linear expansion coefficient among components in the power module. For example, electronic parts such as elements, ICs, and capacitors, and a substrate in the power module are electrically connected to one another by soldering in an appropriate manner. However, there is known a phenomenon that a difference in the linear expansion coefficient between an electronic component and the substrate causes a crack at a soldered portion due to a cyclic fatigue, which eventually results in a breakage of the components.

As a method for retarding the breakage phenomenon, there is known a technique disclosed by Patent Literature 1 that applies and coats an epoxy resin having a linear expansion coefficient similar to a linear expansion coefficient of a solder to electronic components to suppress a stress concentration to an origin of a solder crack and thereby extend the service life of the soldered portion. Further, Patent Literature 1 proposes a structure for improving the service life of a soldered portion by filling an entire substrate disposed in a module with an epoxy resin having a linear expansion coefficient similar to a linear expansion coefficient of the solder.

Further, there is known a structure disclosed by Patent Literature in which the circumference of a wire is coated with a soft polyimide-based resin, and semiconductor elements are potted with an epoxy resin having a linear expansion coefficient similar to a linear expansion coefficient of the solder to prevent a binding force of the epoxy resin from being applied to the wire.

Further, as a method for partitioning a region on a substrate, there is known a method that encloses semiconductor elements with a frame as a separate component, as disclosed in Patent Literature 3.

CITATION LIST

Patent Literature

Patent Document 1: Japanese Unexamined Patent Application Publication No.2005-56873
Patent Literature 2: Japanese Unexamined Patent Application Publication No.2006-351737
Patent Literature 3: Japanese Unexamined Patent Application Publication No.2004-259992

SUMMARY OF INVENTION

Technical Problem

Techniques described in the patent literatures mentioned above are invented for power modules used in respective applications. However, power modules of these days as a vehicle-mounted apparatus to which the present invention is applied need to meet much more strict specifications.

In recent years, demands of a power module mounted in the engine room have been increasing for environmentally friendly vehicles, with a wider range of the operating temperature.

For example, a power module for an idle stop starter is fitted directly to the starter mounted in the engine, and a large current of a few hundred ampere flowing into the starter is controlled by switching of the power module, wherefore there is a tendency that temperature of the power module further increases due to effects of a heat generated in the engine and a self-heating of the power module resulting from supplying the large current.

In the past, requirements of the power module from the vehicle side could be met by using a heat sink or a highly heat-resistant inorganic material substrate having a relatively sufficient heat dissipation function, for example, $Si_3N_4$ (silicon nitride) substrate or AlN (aluminum nitride) substrate. However, components mounted in the engine room of a limited space need to be compact and mountable in a high density area, whereby the heating temperature of power module elements increases and thereby the power module mount structure is made more difficult.

For the problem of a crack developing at a soldered portion under such an environment, there is a high possibility that the service life of the solder can be improved by the solution of Patent Literature 1 "filling with an epoxy resin having a linear expansion coefficient similar to a linear expansion coefficient of the solder". However, an electronic apparatus includes those parts not bonded with the solder, such as a wire composed of aluminum or copper, and a substrate where such parts are mounted. Linear expansion coefficients of those parts are different from a linear expansion coefficient of the solder. Especially, for a wire of a thin metal, sealing the wire as a whole with an epoxy resin having a different linear expansion coefficient causes a breakage of the wire due to failure of stress relaxation against an elongation resulting from a stress generated.

Accordingly, a bonding wire is normally sealed with a soft resin such as a silicone gel. The method disclosed in Patent Literature 2 coats the wire circumference with a soft polyimide resin. However, its curing temperature of about 300° C. is required for a standard product, for which a certain holding time is required. In the course of the temperature history, there may occur oxidation of a copper foil pattern forming a substrate pattern, oxidation of a resist coat protecting a substrate surface, material modulation of an aluminum wire, and deterioration of the service life of electronic parts. Therefore, the method will be less realistic.

In the method disclosed in above Patent Literature 2 that coats the bonded wire circumference with a resin other than the epoxy resin, the wire is once coated with a polyimide-based first resin and then the resin is cured in a curing oven. Then, the epoxy resin is applied to semiconductor elements, and thereafter the epoxy resin needs to be cured. Thus, two curing steps are required in a manufacturing process. This increases the number of manufacturing steps and thereby increases the manufacturing cost.

Further, in a method disclosed in Patent Literature 3 that seals the vicinity of electronic parts by potting with an epoxy resin, the epoxy resin applied as a potting material flows over the substrate due to rheological properties of the epoxy resin and thereby causes a variation in a range which can be sealed with the resin, which may result in quality deterioration.

In view of the above circumstance, it is an object of the present invention to provide a power module invented for easy manufacturing and fatigue reduction at a soldered portion or the like, and a method for manufacturing the same.

Solution to Problem

A power module according to the present invention comprises a substrate where electronic parts are mounted by soldering, and a mold case housing the substrate and including bus bars for electrical connection with an external apparatus. The mold case comprises partition plates forming an electronic part mount area in where electronic parts are mounted on the substrate, and a bonding area for bonding to the bus bars, a first resin cast into the electronic part mount area, and a second resin cast into the bonding area.

A method for manufacturing the power module according to the present invention comprises the steps of: mounting electronic parts on the substrate; fixing, in close contact, the substrate to the mold case fitted with partition plates by using a third resin and thereby forming the electronic part mount area where electronic parts are mounted on the substrate, and the bonding area for connection with an external apparatus; performing bonding operations in the bonding area after the third resin has been cured; casting a first resin into the electronic part mount area; casting a second resin into the bonding area; and curing the first and second resins.

Advantageous Effects of Invention

The power module according to the present invention is capable of improving the reliability on a thermal cyclic fatigue of a solder used to mount electronic parts and aluminum wires, and capable of simultaneously casting and curing the first, and second resins and thereby reducing the manufacturing tact, since the electronic part mount area and the bonding area are completely partitioned from each other by partition plates.

DESCRIPTION OF EMBODIMENTS

Hereinafter, the present invention is described in detail by using the accompanying drawings.
Embodiments A power module according to the present invention comprises a substrate whose surface is divided into two kinds of rooms by partition plates; that is, an electronic part mount area and a bonding area.

Figure 2:
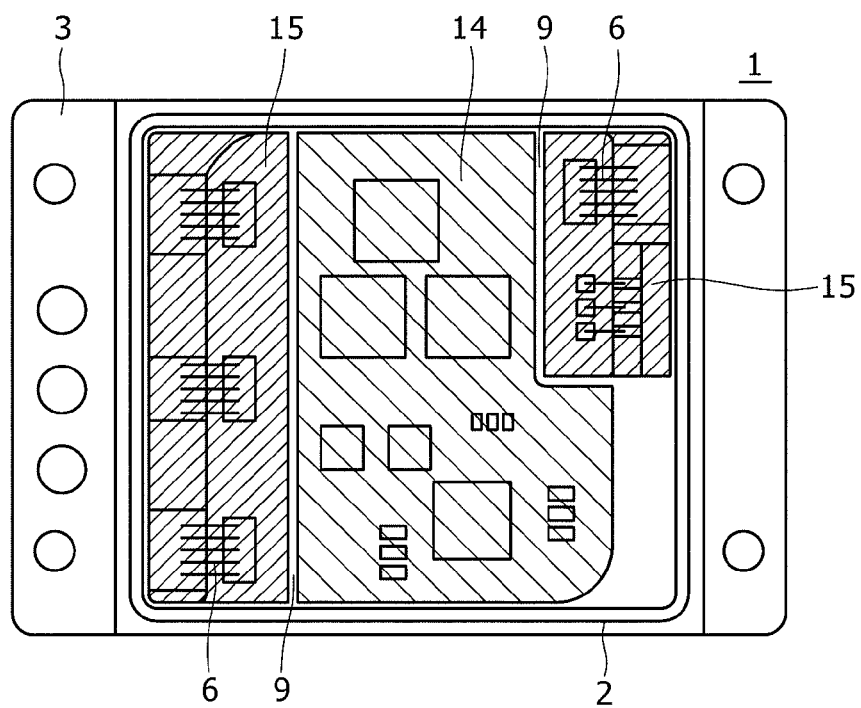
FIG. 2 is a top view of the power module.

FIG. 2 is a top view of the power module according to the present invention. A region of a substrate 2 covered by a mold case 3 is divided into three rooms by partition plates 9. In an example of FIG. 2, each of small rooms on left and right sides is a bonding area 15, and a large room at the center is an electronic part mount area 14.

Figure 1:
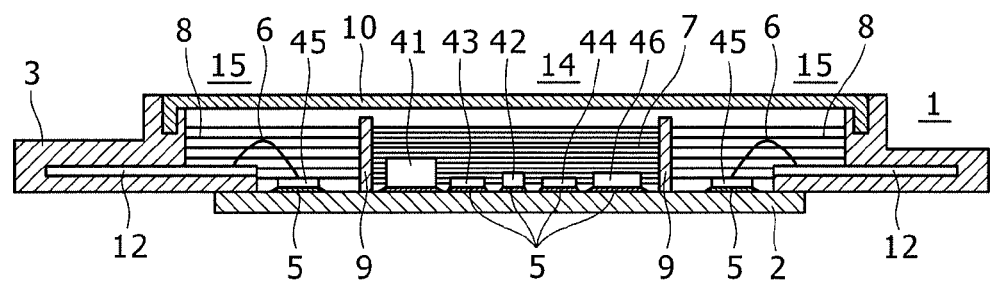
FIG. 1 is a cross sectional view of the power module.

FIG. 1 is a cross sectional view of the power module according to the present invention. FIG. 1 shows that three spaces are formed by partition plates 9 provided on the substrate 2, the mold case 3 provided on sides of the substrate, and a cover 10 on top of the mold case 3. In the electronic part mount area 14 of a central space, electronic parts such as a power semiconductor element 41, a chip capacitor 42, a chip resistor 43, a chip diode 44, and IC 46 are soldered on the substrate 2.

In the bonding area 15 of left and right spaces, an aluminum pad 45 is fixed to the substrate 2 with a solder 5 and connected to an insert bus bar 12 fitted to the mold case 3, by bonding with a wire 6 composed of aluminum, copper or the like. In a case where the power module according to the present invention is applied to an idle stop starter of a vehicle, a current flowing on the substrate is supplied to an external starter by bonding connection.

After components have been connected in respective areas, the electronic part mount area 14 is filled with an epoxy resin as a first resin 7, and the bonding area 15 is filled with a silicone gel as a second resin 8.

Next, components of the power module according to the present invention configured as above are described. Thereafter, a manufacturing method and advantageous effects thereof are described.

First, the substrate 2 comprises a base metal composed of aluminum, copper, iron or an alloy containing such materials, an insulating layer composed of an epoxy-based resin or the like and formed on the base metal of aluminum, and a circuit formed with a copper conductor on the insulating layer.

On the upper surface of the copper conductor, the power semiconductor element 41, the chip capacitor 42, the chip resistor 43, the chip diode 44, the aluminum pad 45, and the IC 46 are electrically connected via solder 5. Although an object of the present invention is to reduce a fatigue at a soldered portion, "solder" herein referred to includes a solder used to bond via a conductive adhesive material, as well as a lead-free solder Sn—3Ag—0.5Cu.

The mold case 3 accommodates the substrate 2, and when applied to an idle stop starter of a vehicle, electrically connects and mechanically couples the power module to an external starter. The mold case 3 is composed of a thermoplastic resin such as PPS (polephenylene sulfide), PBT (polybutylene terephthalate) or the like and comprises an insert-molded insert bus bar 12 composed of copper for electrical connection with the starter.

The insert bus bar 12 of the mold case 3 and the aluminum pad 45 in the bonding area 15 of the substrate 2 are connected with each other by bonding with a wire 6 composed of aluminum, copper or the like for electrical connection to supply a current flowing on the substrate to the external starter.

Here, it is known that from the view point of costs, handling easiness and reliability, an aluminum wire is used as the bonding wire for bonding. The aluminum pad 45 is a bonding pad necessary for bonding the aluminum wire to the substrate 2. The insert bus bar 12 and the aluminum pad 15 may be connected by aluminum ribbon bonding.

In the power module 1, the electronic mount area 14 on the substrate 2 and the bonding area 15 connected to the insert bus bar 12 of the mold case 3 by bonding with aluminum 6 are partitioned from each other by partition plates 9 on the substrate. Next, the partition plate 9 is described in detail.

In the mold case 3, partition plates are formed in a thin shape by integral molding. Thickness of the partition plate is set in a range of 0.5 to 3.0 mm, a thickness favorable in performing the integral molding in view of the resin's flow.

Figure 3:
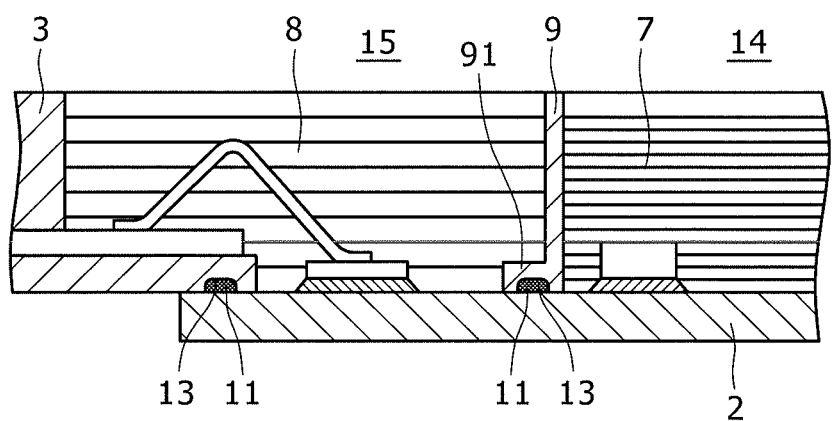
FIG. 3 is a cross sectional view showing a connection relationship between a mold case 3 and a substrate 2.
Figure 4:
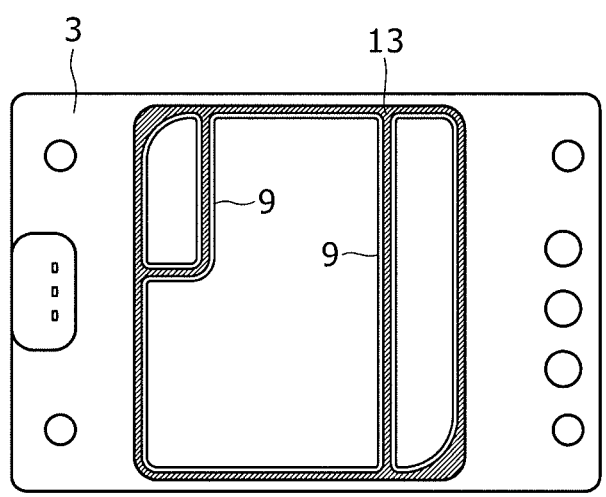
FIG. 4 is a plan view of the mold case 3.

Since the partition plate 9 is molded integrally with the mold case 3, the shape thereof can be determined by inflecting according to a space required for bonding as shown in FIG. 2. Thus, the partition plate 9 is formed by inflecting so as to partition the electronic part mount area 14 and the bonding area 15 from each other to minimum required areas, so that parts can be mounted by efficiently utilizing the substrate area Although partition, plats 9 are integrally molded with the mold case 3, the mold case 3 and the substrate 2, in a relationship thereof with partition plates 9, need to be fixed in close contact by using a resin. FIG. 3 is a cross sectional view showing a configuration for fixing partition plates 9 or the mold case 3 and the substrate 2 in close contact with each other. FIG. 4 is a plan view of the mold case 3.

In FIG. 3, a substrate receiving surface 91 of the partition plate 9 is provided on the side of the bonding area 15 to secure a contact area with the substrate 2. Further, a resin receiving groove 13 is formed in the substrate receiving surface 91 of the partition plate 9. Further, resin receiving grooves 13 shown in FIG. 3 and FIG. 4 are formed on a contact surface between the mold case 3 and the substrate 2.

In the relationship among the partition plate 9, mold case 3 and substrate 2, such a configuration enables the partition plate 9, mold case 3 and substrate 2 to be fixed in close contact with each other by casting and curing a third resin between the substrate 2 and resin receiving grooves 13. With this arrangement, the electronic part mount area 14 and the bonding area 15 can be completely separated from each other on the substrate 2. Here, a silicon adhesive is preferably used as the third resin 11.

Further, the substrate receiving surface 91 of the partition plate 9 is formed in an L-like shape in the bonding area 15. Thus, there is no projection of the substrate receiving surface 91 to the electronic part mount area 14, so that an ample space is available in the electronic part mount area 14.

Further, since the L-shaped substrate receiving surface 91 reinforces the partition plate 9, thickness of the partition plate can be reduced. Further, since a section area of the partition plate 9 can be secured, resin's flow around the partition plate can be improved and thereby the thickness of the partition plate can be reduced.

Further, the space of the bonding area 15 is predetermined so that a bonding tool of the bonding machine does not interfere with the partition plate 9. Therefore, height of the substrate receiving surface 91 of the partition plate 9 is predetermined so as not to interfere with a tip of the bonding machine, so that there is no need to further expand the bonding area 15 to cover the space of the substrate receiving surface.

Figure 5:
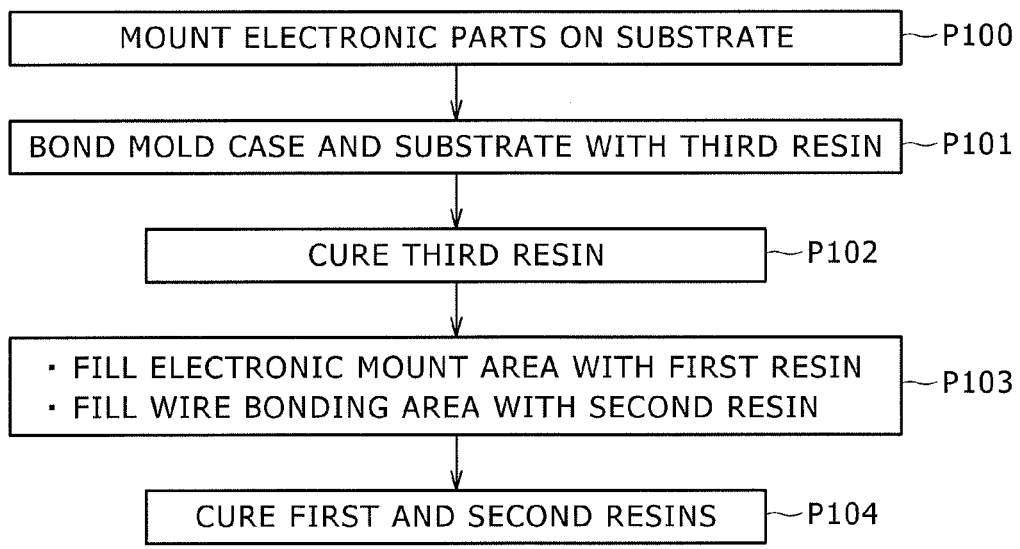
FIG. 5 shows a manufacturing process of the power module.

FIG. 5 shows a manufacturing process of the power module according to the first embodiment of the present invention. In the manufacturing process, electronic parts are mounted on the substrate 2 in a first process P100, the mold case 3 and the substrate 2 are fixed in close contact with each other by using the third resin as described with reference to FIG. 3 in a second process P101, and the resin is cured in a third process P102. Further, after bonding operations in the bonding area 15, the electronic part mount area 14 is filled with an epoxy resin as a first resin 7, and the bonding area is filled with a silicone gel as a second resin 8 in a fourth process P103, and the resins are cured in a fifth step P104.

Here, a linear expansion coefficient of the epoxy resin used as the first resin 7 in the fourth process P103 is set to about 12 to $23\times10^{-6}/°$ C. such that coverage of electronic parts therewith extends the service life of the solder by reducing a stress concentration thereto. The stress concentration may result in a breakage of the solder due to a big difference in the linear expansion coefficient between electronic parts and an aluminum base substrate.

The silicone gel used as the second resin 8 in the fourth process P103 electrically insulates, for its gel-like nature, aluminum wires without applying a stress thereto. Further, an appropriate second resin preferably has insulating and thermoplastic properties and low elastic modulus.

The two types of resins mentioned above are selected so that both of them can be cured at a same curing temperature. Therefore, both of them can be cured simultaneously in a same curing oven. In the present embodiment, the two resins have been selected so as to cure at 130° C. to 150° C.

The areas in the power module are completely separated by partition plates so as to prevent mixing of the two types of resins, and contact surfaces between partition plates 9 and the substrate 2 are completely fixed in close contact with each other. With this configuration, the epoxy resin and the silicone gel, both not curable when mixed, can be filled and cured simultaneously.

In the power module according to the present invention, the electronic part mount area 14 and the bonding area 15 are completely separated by partition plates 9 integrally molded with the mold case. As shown in the process of FIG. 5, this configuration allows to, after bonding the mold case 3 and the substrate 2 with a silicon adhesive to each other, fill the electronic part mount area 14 with the first resin 7 and the bonding area 15 with the second resin 8 respectively and then cure the two types of resins simultaneously. Consequently, the manufacturing tact can be reduced compared with a conventional structure where resins are cured one by one.

According to the embodiment of the present invention described above, many advantageous effects described below can be obtained by adopting the partition plates.

First, the configuration of partition plates integrally molded with the mold case reduces the number of parts and enables provision of a less expensive power module structure, compared with a configuration where only an electronic part section is partitioned with a partition plate fitted as a separate component.

Further, an area sealed with epoxy resin can be defined accurately by using partition plates, so that warp variation of the cured epoxy resin can be stabilized and thereby the quality can be stabilized.

With a resin receiving groove provided on a surface of the partition plate in contact with the substrate, the partition plate and the substrate can be fixed in close contact with each other while preventing flow-out of the resin therefrom, and also a cross section of the partition plate can be secured, whereby excellent moldability can be obtained without increasing thickness of the partition plate.

Further, the partition plate serves as a beam in the power module, so that deflection of the power module can be reduced.

Figure 6:
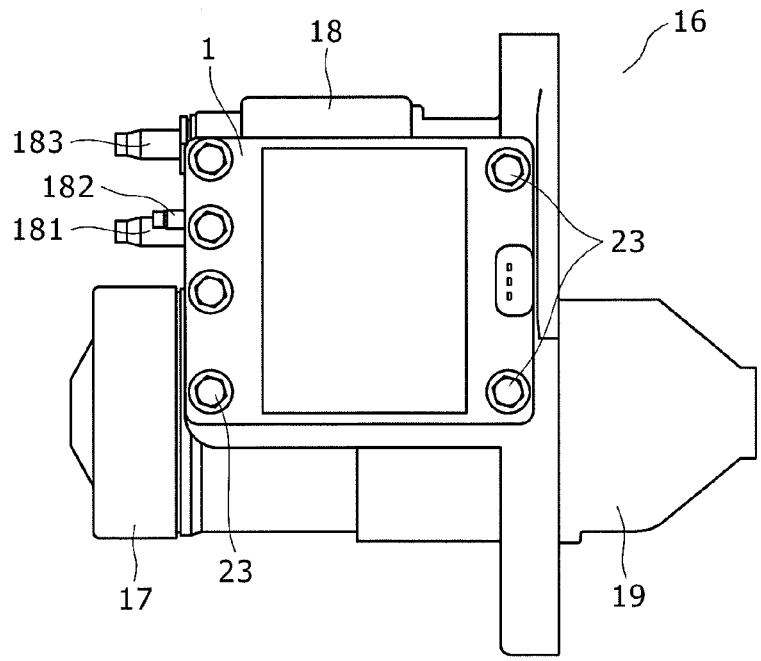
FIG. 6 is a side view of a power module according to an embodiment of the present invention applied to an idle stop starter.
Figure 7:
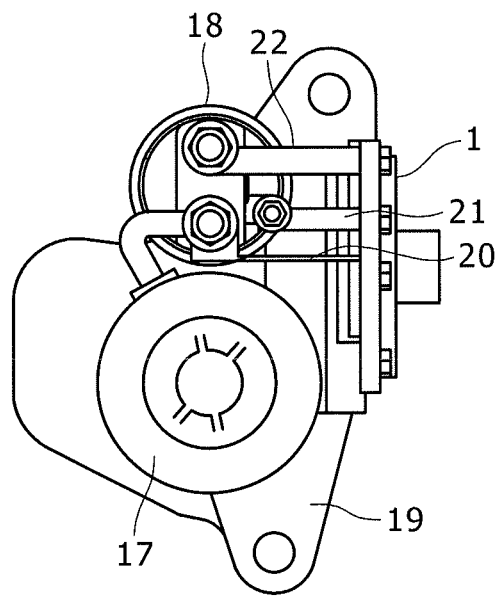
FIG. 7 is a side view of a power module according to an embodiment of the present invention applied to an idle stop starter.
Figure 8:
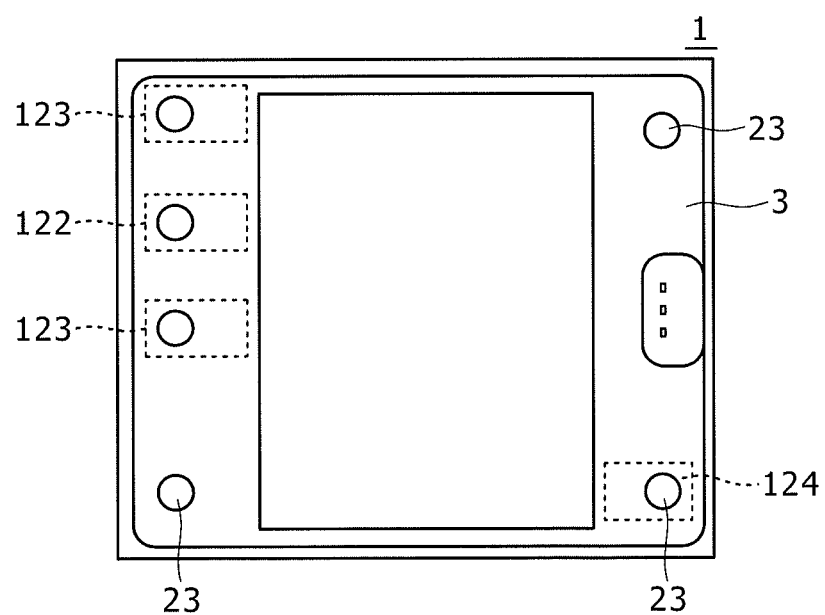
FIG. 8 is a structure diagram of the power module according to the embodiment of the present invention applied to the idle stop starter.

As an optimum application example of the power module according to the present invention, an embodiment of the power module applied to a vehicle-mount idle stop starter is shown in FIG. 6 to FIG. 8.

In FIG. 6 to FIG. 8, 16 represents an idle stop starter, 1 represents a power module, 17 represents a starter motor, 18 represents a magnet switch, 19 represents a gear case, 181 represents a motor terminal, 182 represents a switch terminal, 20 represents a motor bus bar, 21 represents a switch bus bar, 22 represents a battery bus bar, and 23 represents a power module fixing point.

The idle stop starter 16 comprises the starter motor 17 configured to rotate a pinion gear (not shown) engaged with the engine (not shown) and thereby rotate the engine, the magnet switch 18 configured to push out the pinion gear of the idle stop starter 16 to engage with the engine, and the power module 1 according to the present invention.

The power module 1 receives an idle stop command signal from ECU (not shown) and then switch ON/OFF power semiconductor elements in the power module to control a current supplied to the starter motor 17 for idle stop of the vehicle.

The starter motor 17 and the magnet switch 18 are fixed with the outer circumference thereof sandwiched by the gear case 19.

The idling stop starter is fitted to the engine via the gear case 19.

The magnet switch 18 comprises a motor terminal 181, a switch terminal 182, and a battery terminal 183. The motor terminal 181 is connected to the starter motor 17, and the battery terminal 183 is connected to a battery (not shown) of the vehicle.

The switch terminal 182 serves to push out a pinion gear (not shown) in the starter motor 17 to engage with the engine. When a current is supplied to the switch terminal 182, a lever (not shown) in the magnet switch 18 is driven to push out the pinion gear (not shown) in the starter motor toward the engine.

The power module 1 is secured by screws at power module fixing points 23 to the gear case 19 molded of aluminum die cast.

In FIG. 8, a motor insert bus bar 121, a switch insert bus bar 122, a battery insert bus bar 123, and a GND insert bus bar 124 are insert-molded as insert bus bars in the mold case 3 of the power module 1. The motor insert bus bar 121 is electrically connected to a drain terminal of MOSFET (not shown) for switching ON/OFF a current supplied to the starter motor 17 mounted on the substrate 2.

The switching insert bus bar 122 is electrically connected to a drain terminal of MOSFET (not shown) for switching ON/OFF a current supplied to the magnet switch 18. The battery insert bus bar 123 is electrically connected to a source terminal of the MOSFET and to a battery line in the substrate 2. The GND insert bus bar 124 is electrically connected to a GND line in the substrate 2.

A motor bus bar 20, a switch bus bar 21, and a battery bus bar 22 are respectively secured by screw to the motor insert bus bar 121, the switch insert bus bar 122, and the battery insert bus bar 123.

Further, the motor bus bar 20, the switch bus bar 21, and the battery bus bar 22 are respectively secured by screw to the motor terminal 181, the switch terminal 182, and the battery terminal of the magnet switch 18.

The GND insert bus bar 24 is simultaneously connected to the gear case 19 when fixed to one of the power module fixing points 23.

The motor terminal 181 of the magnet switch 18 is connected to the starter motor 17.

Consequently, idle stop of a vehicle can be made by switching ON the MOSFET with the idle stop command signal sent from ECU (not shown).

Industrial Applicability

The present invention provides a power module invented for easy manufacturing and fatigue reduction at a soldered portion, and a method for manufacturing the same. In particular, as the power module is capable of handling a large current, it can be expected that the power module is widely applied to a vehicle-mount idle stop starter as a vehicle-mounted power module.

LIST OF REFERENCE SIGNS

1: Power module
2: Substrate
3: Mold case
41: Power semiconductor element
42: Chip capacitor
43: Chip resistor
44: Chip diode
45: Aluminum pad
46: IC
5: Solder
6: Wire
7: First resin
8: Second resin
9: Partition plate
91: Substrate receiving surface
10: Cover
11: Third resin
12: Insert bus bar
121: Motor insert bus bar
122: Switch insert bus bar
123: Battery insert bus bar
124: GND insert bus bar
13: Resin receiving groove
14: Electronic part mount area
15: Bonding area
16: Idle stop starter
17: Starter motor
18: Magnet switch
181: Motor terminal
182: Switch terminal
183: Battery terminal
19: Gear case
20: Motor bus bar
21: Switch bus bar
22: Battery bus bar
23: Power module fixing point

The invention claimed is:

1. A power module comprising: a substrate, electronic parts being mounted on the substrate by soldering; and
a mold case, the mold case housing the substrate and including bus bars for electrical connection with an external apparatus,
wherein the substrate includes:
a bonding area for bonding from pads located on the bonding area to the bus bars; and
an electronic part mount area where the electronic parts are mounted on the substrate;
wherein the mold case includes:
at least one partition plate that divides the bonding area and the electronic part mount area;
a first resin cast into the electronic part mount area; and
a second resin cast into the bonding area;
wherein the at least one partition plate is integrally molded with the mold case, and a resin receiving groove filled with a third resin for bonding the mold case and the at least one partition plate to the substrate is formed on a surface where the mold case and the at least one partition plate are in contact with the substrate; and the resin receiving groove located on a portion extended in parallel to the substrate from the mold case and the at least one partition plate toward the bonding area.

2. The power module according to claim 1, wherein the first resin and the second resin are selected such that both of the resins can be cured at a same curing temperature.

3. The power module according to claim 1, wherein an epoxy resin is used as the first resin, and silicone gel is used as the second resin.

4. The power module according to claim 1, wherein the at least one partition plate comprises a portion vertical to the substrate and a portion parallel to the substrate, and the parallel portion is provided on the side of the bonding area.

5. The power module according to claim 4, wherein the resin receiving groove for bonding is provided at the portion parallel to the substrate.

6. The power module according to claim 1, wherein the resin receiving groove for bonding is filled with a silicon-based resin as the third resin.

7. The power module according to claim 2, wherein an epoxy resin is used as the first resin, and silicone gel is used as the second resin.

8. The power module according to claim 4, wherein the resin receiving groove for bonding is filled with a silicon-based resin as the third resin.

9. The power module according to claim 5, wherein the resin receiving groove for bonding is filled with a silicon-based resin as the third resin.

10. The power module according to claim 1, wherein the at least one partition plate and the mold case are configured to be attachable to the substrate simultaneously.

11. The power module according to claim 1, wherein the resin receiving groove is filled with the third resin that bonds the at least one partition plate and the mold case to the substrate.

* * * * *